(12) United States Patent
Kumar

(10) Patent No.: US 8,324,783 B1
(45) Date of Patent: Dec. 4, 2012

(54) NON-DECAYING ELECTRIC POWER GENERATION FROM PYROELECTRIC MATERIALS

(75) Inventor: Santosh Kumar, San Jose, CA (US)

(73) Assignee: Ultrasolar Technology, Inc., Santa Clara, CA (US)

( * ) Notice: Subject to any disclaimer, the term of this patent is extended or adjusted under 35 U.S.C. 154(b) by 0 days.

(21) Appl. No.: 13/454,921

(22) Filed: Apr. 24, 2012

Related U.S. Application Data

(66) Substitute for application No. 13/314,042, filed on Dec. 7, 2011.

(51) Int. Cl.
H02N 10/00 (2006.01)
H01L 41/04 (2006.01)

(52) U.S. Cl. .................................. 310/306; 310/311
(58) Field of Classification Search .................. 310/306, 310/311
See application file for complete search history.

(56) References Cited

U.S. PATENT DOCUMENTS

| | | |
|---|---|---|
| 5,644,184 A | 7/1997 | Kucherov |
| 5,678,106 A | 10/1997 | Goto et al. |
| 5,739,532 A | 4/1998 | Imada et al. |
| 5,804,823 A | 9/1998 | Ramer et al. |
| 5,860,741 A | 1/1999 | Tsao et al. |
| 5,891,581 A | 4/1999 | Simpson et al. |
| 6,013,311 A | 1/2000 | Chatterjee et al. |
| 6,073,294 A | 6/2000 | Mashtare et al. |
| 6,308,356 B1 | 10/2001 | Frederick et al. |
| 6,379,809 B1 | 4/2002 | Simpson et al. |
| 6,515,582 B1 | 2/2003 | Teowee et al. |
| 6,528,898 B1 | 3/2003 | Ikura et al. |
| 6,563,400 B2 | 5/2003 | Itasaka et al. |
| 6,566,666 B2 | 5/2003 | Yoo |
| 7,034,411 B2 | 4/2006 | Chen et al. |
| 7,397,301 B1 | 7/2008 | Brocato |
| 7,479,727 B1 | 1/2009 | Grace |
| 7,532,786 B2 | 5/2009 | Poovey |
| 7,560,639 B2 | 7/2009 | Kanno et al. |
| 7,791,019 B2 | 9/2010 | Beauchamp et al. |
| 7,807,917 B2 | 10/2010 | Atanackovic |
| 7,816,601 B2 | 10/2010 | Carver |
| 7,878,453 B2 | 2/2011 | Liggett |
| 7,944,118 B2 | 5/2011 | Peacock |
| 7,960,704 B2 | 6/2011 | Bromberg et al. |
| 7,964,784 B2 | 6/2011 | Schmidt |
| 7,982,360 B2 | 7/2011 | Erbil et al. |
| 8,003,982 B2 | 8/2011 | Wang et al. |
| 2001/0054307 A1 | 12/2001 | Hirota et al. |

(Continued)

FOREIGN PATENT DOCUMENTS

EP 0640815 A1 3/1995

(Continued)

*Primary Examiner* — Derek Rosenau
(74) *Attorney, Agent, or Firm* — Raj Abhyanker, P.C.

(57) ABSTRACT

A method, an apparatus and/or a system of non-decaying electric power generation from pyroelectric materials is disclosed. In one aspect, a method includes generating a substantially continuous electric energy from an at least one layer of pyroelectric material when the at least one layer of pyroelectric material is subjected to a temporal temperature gradient, a varying electric field and/or a mechanical oscillation. The method also includes creating the temporal temperature gradient, the varying electric field and/or the mechanical oscillation through coupling the at least one layer of pyroelectric material in between a first layer of a first material and a second layer of a second material that harnesses a heat energy and/or an electric field energy to produce the temporal temperature gradient and/or the mechanical oscillation to which the at least one layer of pyroelectric material is subjected.

7 Claims, 10 Drawing Sheets

U.S. PATENT DOCUMENTS

| | | |
|---|---|---|
| 2002/0039499 A1 | 4/2002 | Kamei et al. |
| 2002/0190209 A1 | 12/2002 | Schubring et al. |
| 2004/0150298 A1 | 8/2004 | Styblo et al. |
| 2004/0251690 A1 | 12/2004 | Chen et al. |
| 2005/0034593 A1 | 2/2005 | LeBourgeois |
| 2005/0073150 A1 | 4/2005 | Patel et al. |
| 2005/0120529 A1 | 6/2005 | Kashiwaya et al. |
| 2005/0196322 A1 | 9/2005 | Truex et al. |
| 2005/0274176 A1 | 12/2005 | Thiesen et al. |
| 2006/0017353 A1 | 1/2006 | Sakai |
| 2006/0118765 A1 | 6/2006 | Lubomirsky |
| 2006/0131680 A1 | 6/2006 | Akiyama et al. |
| 2006/0163482 A1 | 7/2006 | Mantese |
| 2007/0049829 A1 | 3/2007 | Kaminski et al. |
| 2007/0108385 A1 | 5/2007 | Mantese et al. |
| 2007/0158640 A1 | 7/2007 | Halilov et al. |
| 2007/0283769 A1 | 12/2007 | Glaser et al. |
| 2008/0053513 A1 | 3/2008 | Palmer |
| 2008/0295879 A1 | 12/2008 | Atanackovic |
| 2008/0315100 A1 | 12/2008 | Han et al. |
| 2009/0009923 A1 | 1/2009 | Tocco |
| 2009/0056783 A1 | 3/2009 | Jong |
| 2009/0058223 A1 | 3/2009 | Micallef |
| 2009/0064476 A1 | 3/2009 | Cross et al. |
| 2009/0134747 A1 | 5/2009 | Reichmann et al. |
| 2009/0307885 A1 | 12/2009 | Nihei |
| 2010/0011768 A1 | 1/2010 | Hacsi |
| 2010/0060109 A1 | 3/2010 | Russell et al. |
| 2010/0133954 A1 | 6/2010 | Despesse et al. |
| 2010/0147349 A1 | 6/2010 | DiFoggio |
| 2010/0194245 A1 | 8/2010 | Harigai et al. |
| 2010/0295419 A1 | 11/2010 | Fujii |
| 2010/0304259 A1 | 12/2010 | Chan et al. |
| 2011/0001390 A1 | 1/2011 | Erbil et al. |
| 2011/0057546 A1 | 3/2011 | Vaidyanathan |
| 2011/0063376 A1 | 3/2011 | Morozumi et al. |
| 2011/0080134 A1 | 4/2011 | Miller |
| 2011/0084572 A1 | 4/2011 | Hawwa et al. |
| 2011/0163232 A1 | 7/2011 | Yamamura |
| 2011/0169372 A1 | 7/2011 | Lim |
| 2011/0280276 A1 | 11/2011 | Mainguet et al. |
| 2012/0056504 A1 | 3/2012 | Hunter et al. |
| 2012/0060898 A1 | 3/2012 | Ahlgren et al. |

FOREIGN PATENT DOCUMENTS

| | | |
|---|---|---|
| EP | 0656429 B1 | 6/1995 |
| EP | 0867700 A1 | 9/1998 |
| EP | 1138914 A1 | 10/2001 |
| EP | 1202336 A1 | 5/2002 |
| EP | 1291629 A2 | 3/2003 |
| EP | 1679751 A2 | 7/2006 |
| EP | 1858092 A1 | 11/2007 |
| EP | 1939152 A1 | 7/2008 |
| EP | 2017239 A1 | 1/2009 |
| EP | 2101165 A1 | 9/2009 |
| EP | 1276220 B1 | 6/2010 |
| EP | 2301994 A1 | 3/2011 |
| WO | 2007099279 A1 | 9/2007 |
| WO | 2009126344 A2 | 10/2009 |

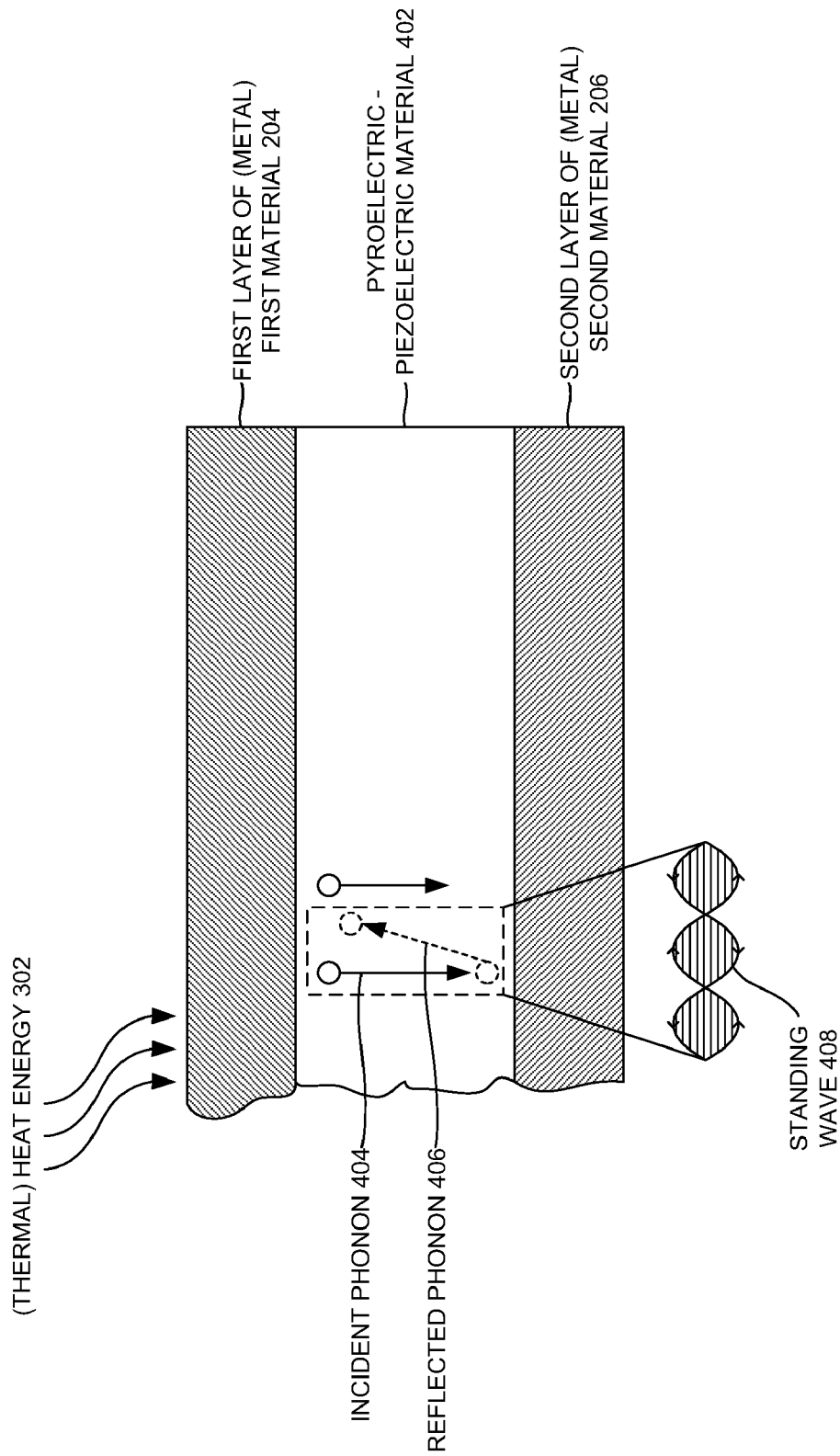

US 8,324,783 B1

NON-DECAYING ELECTRIC POWER GENERATION FROM PYROELECTRIC MATERIALS

CLAIM OF PRIORITY

This Application claims priority to application Ser. No. 13/314,042 entitled "NON-DECAYING ELECTRIC POWER GENERATION FROM PYROELECTRIC MATERIALS" filed on Dec. 7, 2011 which application is all also incorporated by reference herein in its entirety.

FIELD OF INVENTION

This disclosure relates to electric power generation and in particular to non-decaying electric power generation from pyroelectric materials.

BACKGROUND

Pyroelectric materials may generate electric energy (e.g., temporary voltage) when they are subjected to a change in temperature (e.g., heated or cooled). If the temperature stays constant, the electric energy generated by the pyroelectric material gradually disappears due to leakage current (e.g., the leakage can be due to electrons moving through the crystal, ions moving through the air, current leaking through a voltmeter attached across the crystal, etc.). The gradual decay of the electric energy generated by the pyroelectric material may render the pyroelectric materials inept for use in applications that rely on substantially continuous electric energy.

SUMMARY

Disclosed are a method, an apparatus and/or a system of non-decaying electric power generation from pyroelectric materials. In one aspect, a method includes generating a substantially continuous electric energy from an at least one layer of pyroelectric material when the at least one layer of pyroelectric material is subjected to a temporal temperature gradient, a varying electric field and/or a mechanical oscillation. The method also includes creating the temporal temperature gradient, the varying electric field and/or the mechanical oscillation through coupling the at least one layer of pyroelectric material in between a first layer of a first material and a second layer of a second material that harnesses a heat energy and/or an electric field energy to produce the temporal temperature gradient and/or the mechanical oscillation to which the at least one layer of pyroelectric material is subjected.

When the first layer of the first material and the second layer of the second material are a metal coating that radiates black body radiation, the method further includes the first layer of the first material and the second layer of the second material to generate the temporal temperature gradient in the at least one layer of pyroelectric material through creation of an infrared standing wave when the first layer of the first material absorbs the heat energy and radiates an infrared wave to the second layer of second material through the at least one layer of pyroelectric material and the second layer of the second material reflects the infrared wave to interfere with the incident infrared wave to form an infrared standing wave. When the first material is a pyroelectric material that is highly polarized and the second material is another pyroelectric material that is strongly polarized with an orientation of polarity different from the polarity of the first material and an at least two layers of pyroelectric material that is coupled in between the first layer of first material and the second layer of second material is a pyroelectric material that is of weaker polarization than the pyroelectric material of the first layer of the first material and the pyroelectric material of the second layer of the second material and each of the at least two layers of pyroelectric material is of a different orientation of polarity from each other, the method also includes the first layer of the first material and the second layer of the second material to generate a substantially continuous electric energy from the at least two layers of pyroelectric material through creating the varying electric field strengths between each layer of the at least two layers of pyroelectric materials via an electrostatic induction effect.

When the first material is a thermally ionizable material and the second material is a conducting material, the method further includes the first layer of the first material and the second layer of the second material to create an ionic charge based electric field which when the at least one layer of pyroelectric material coupled in between the first layer of the first material and the second layer of the second material is subjected to in the presence of a heat energy generates substantially continuous electric energy through exploiting a change in an orientation of an electric dipole associated with the at least one layer of pyroelectric material based on at least one of the ionic charge based electric field and the heat energy. When the first material and the second material are a metal coating that radiates black body radiation and when the at least one layer of pyroelectric material comprises a piezoelectric characteristic along with the pyroelectric characteristic, the method includes the at least one layer of pyroelectric material comprising a piezoelectric characteristic along with the pyroelectric characteristic to generate the substantially continuous electric energy through a resonance effect created when the at least one layer of pyroelectric material comprising a piezoelectric characteristic along with the pyroelectric characteristic is subjected to at least one of the heat energy and the electric field energy.

The method of generating the substantially continuous electric energy from the at least two layers of pyroelectric material via the first layer of the first material and the second layer of the second material through creating the varying electric field strengths between each layer of the at least two layers of pyroelectric materials via an electrostatic induction further includes polarizing a first layer of the at least two layers of pyroelectric material when the first layer of the at least two layers of pyroelectric material is subjected to at least one of the heat energy and due to an electromagnetic induction from the first layer of first material that is strongly polarized. The first layer of first material may be adjacent to first layer of the at least two layers of pyroelectric material. The method also includes changing an electric field strength associated with a second layer of the at least two layers of pyroelectric material through the electric field associated with the first layer of the at least two layers of pyroelectric material that is generated through polarizing the first layer of the at least two layers of pyroelectric material. The method also includes discharging the first layer of the at least two layers of pyroelectric material through a discharge circuit.

The method of generating substantially continuous electric energy from at least one layer of pyroelectric material coupled between a layer of thermally ionizable material and/or a conducting material may further include creating an ionic charge based electric field between the ionic layer and the conduction layer between which the at least one layer of pyroelectric material is coupled when the ionic layer is subjected to a heat energy. The method also includes changing the orientation of the electric dipole associated with the at least one layer of pyroelectric material from an initial orientation to another orientation when the at least one layer of pyroelectric material is subjected to the heat energy. The method includes rotating the electric dipole back to the initial orientation from the other orientation through the ionic charge based electric field energy associated with the electric field created between the ionic layer and the conduction layer between which the at least one layer of pyroelectric material is coupled when the electric dipole stops changing its orientation based on the heat energy and is currently at the other orientation. The method further includes generating an electric energy based on at least one of the change in the orientation of the electric dipole associated with the at least one layer of pyroelectric material from the initial orientation to the other orientation due to the heat energy and from the other orientation back to the initial orientation due to the ionic charge based electric field energy. The electric energy generated may be proportional to the degree of change in orientation of the electric dipole associated with the at least one layer of pyroelectric material.

BRIEF DESCRIPTION OF FIGURES

Example embodiments are illustrated by way of example and not limitation in the figures of the accompanying drawings, in which like references indicate similar elements and in which:

FIG. 4 illustrates generation of substantially continuous electric power from a pyroelectric-piezoelectric material when a pyroelectric-piezoelectric material is coupled between two metal layers, according to one or more embodiments.

FIG. 5C and FIG. 5D illustrates generation of a substantially continuous electric energy from the at least two layers of pyroelectric material coupled between strongly polarized pyroelectric materials, according to one or more embodiments.

Other features of the present embodiments will be apparent from the accompanying drawings and from the detailed description that follows.

DETAILED DESCRIPTION

In one embodiment, a pyroelectric material may produce electric charge when subjected to a change in temperature (e.g., when the pyroelectric material is heated and/or cooled). In one embodiment, the pyroelectric material may be subjected to a change in temperature with respect to time (e.g., temporal temperature gradient) to generate a non-decaying electric energy. In one embodiment, the temporal temperature gradient may be a change in temperature with respect to time. In one embodiment, the temporal temperature gradient may be a substantially continuous change in temperature with respect to time (e.g., temporal change in temperature dT/dt). In one embodiment, the substantially continuous change in temperature with respect to time may be maintained through various means mentioned in the later paragraphs. In one embodiment, the change in temperature may modify the position of the atoms slightly within the pyroelectric material such that that the polarization of the material changes. In one embodiment, this polarization change may result in a voltage across the crystal. In one embodiment, the polarization of a pyroelectric may also be modified through subjecting the pyroelectric material to an electric field. In one embodiment subjecting the pyroelectric material to both change in temperature and/or an electric field may result in generating a non-decaying electric energy from the pyroelectric material.

In one embodiment, a pyroelectric material may also be a piezoelectric. In one embodiment, the pyroelectrics material that include piezoelectric characteristics as well may generate an electric field when subjected to pressure and/or create a mechanical vibration when subjected to an electric field. In one embodiment, if the mechanical vibration and the electric field exist nearly simultaneously in the pyroelectric material that possesses piezoelectric characteristics as well, then a non-decaying form of electric energy may be generated.

In one embodiment, a substantially continuous electric energy may be generated from an at least one layer of pyroelectric material when the at least one layer of pyroelectric material is subjected to a temporal temperature gradient, a varying electric field and/or a mechanical oscillation. In one embodiment, the temporal temperature gradient, the varying electric field and the mechanical oscillation may be created through coupling the at least one layer of pyroelectric material in between a first layer of a first material and a second layer of a second material that harnesses a heat energy and/or an electric field energy to produce the temporal temperature gradient and/or the mechanical oscillation to which the at least one layer of pyroelectric material is subjected.

Figure 1:
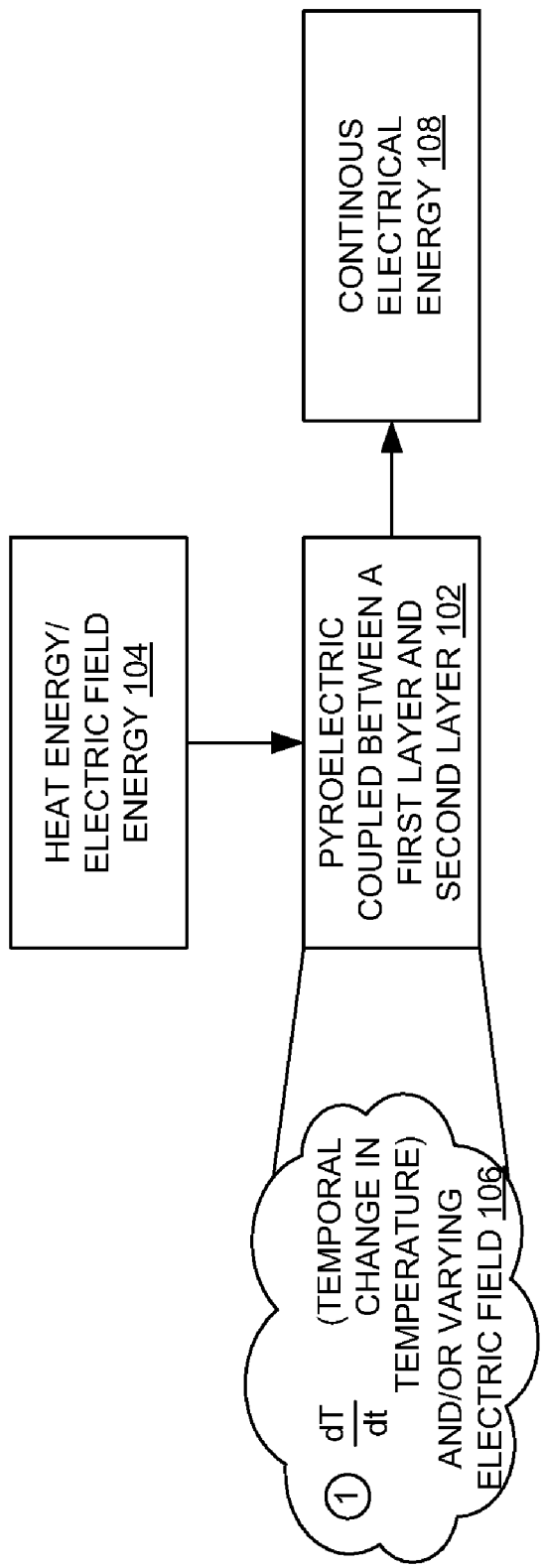
FIG. 1 illustrates a process flow of generating non-decaying electric energy from a pyroelectric material, according to one or more embodiments.

FIG. 1 illustrates a process flow of generating non-decaying electric energy from a pyroelectric material, according to one or more embodiments. In particular, FIG. 1 illustrates a heat energy and/or an electric field energy 104, a pyroelectric material coupled between a first layer of a first material and a second layer of the second material 102, a temporal change in temperature and/or a varying electric field 106 and/or a substantially continuous electric energy 108.

In one embodiment, the source of the heat energy and/or electric field energy 104 may be an artificial source of energy.

In one embodiment, the source of the heat energy may be a natural source of energy (e.g., sun). In one embodiment, the heat energy and/or electric energy 104 may be subjected on a pyroelectric material coupled between a first layer of a first material and a second layer of a second material 102. In one embodiment, the heat energy and/or electric energy 104 may be subjected on a pyroelectric material coupled between a first layer of a first material and a second layer of a second material 102 through the first layer of the first material and/or the second layer of the second material. In one embodiment, the pyroelectric material may be coupled between a first layer of a first material and a second layer of a second material to generate a substantially continuous electric energy from the pyroelectric material. The arrangement of the pyroelectric material in between the first layer of the first material and the second layer of the second material may be described in FIG. 2

Figure 2:
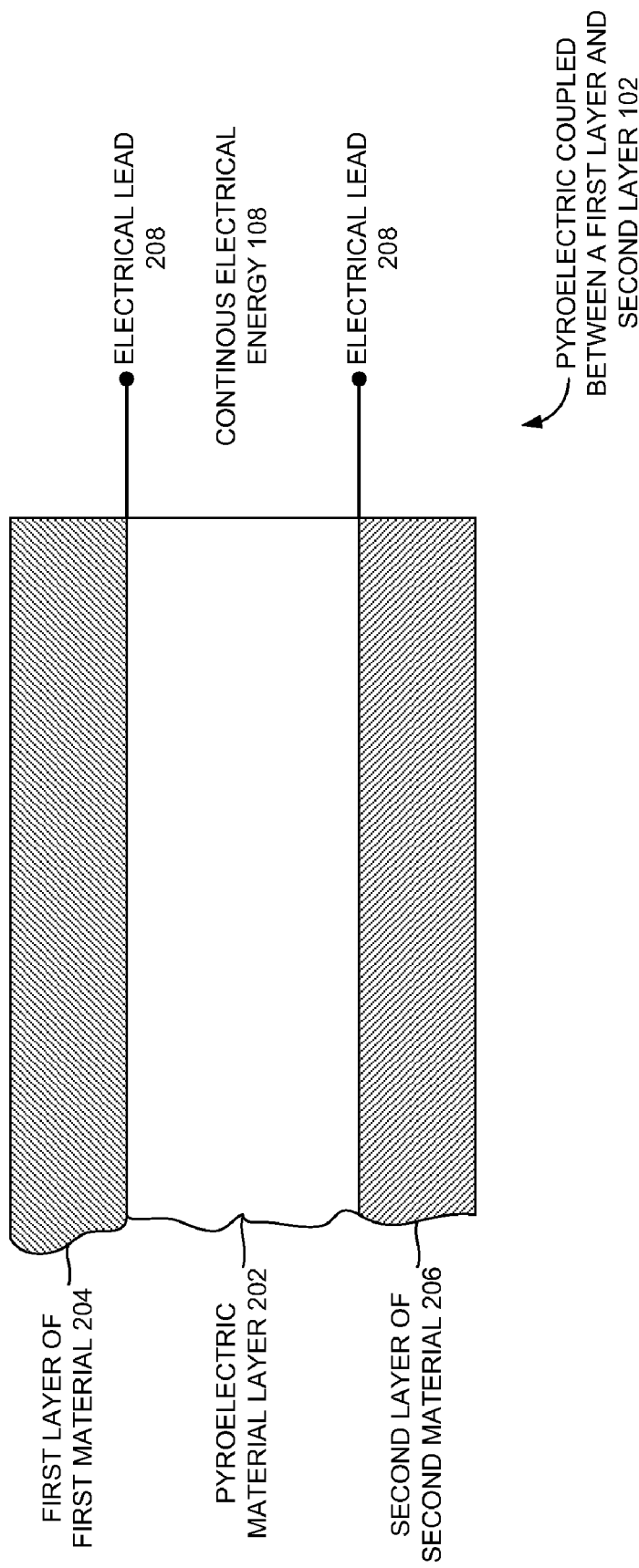
FIG. 2 illustrates a 2-D structural view of the pyroelectric material coupled between a first layer of a first material and a second layer of a second material shown in FIG. 1, according to one or more embodiments.

Now refer to FIG. 2 and FIG. 1. FIG. 2 illustrates a 2-D structural view of the pyroelectric material coupled between a first layer of a first material and a second layer of a second material shown in FIG. 1, according to one or more embodiments. In particular, FIG. 2 illustrates a first layer of a first material 204, a second layer of a second material 206, a pyroelectric layer 202, electrical leads 208 and/or substantially continuous electric energy 108.

In one embodiment, the first layer of the first material 204 and the second layer of the second material 206 may harness a heat energy and/or an electric field energy 104 to produce a temporal change of temperature (dT/dt) and/or the mechanical oscillation 106 to which the at least one layer of pyroelectric material is subjected to generate a non-decaying electric energy. In one embodiment, first layer of the first material 204 may be coupled to one surface of the pyroelectric material 202 and the second layer of the second material may be coupled to a surface of the pyroelectric material that is opposite to the surface of the pyroelectric material to which the first layer of the first material is coupled. In another embodiment, the first layer of the first material 204 and/or the second layer of the second material 206 may enclose the pyroelectric material 202.

In one embodiment, the first material and the second material may be the same material. In one embodiment, the first material and the second material may be different materials. In one embodiment, the first layer of the first material 204 may and/or the second layer of the second material 206 may be inter alia a material that radiates black body radiation, a pyroelectric material, a thermally ionizable material and/or a metal. In one embodiment, the first material and/or the second material may determine the generation of the non-decaying electric energy from the pyroelectric material 202 that may be coupled in between the first layer of the first material 204 and the second layer of the second material 206.

In one embodiment, the pyroelectric material 202 may be a material that generates electric energy when the material is cooled and/or heated. In one embodiment, the pyroelectric material 202 may be an optically transparent and/or opaque material. In an example embodiment, the pyroelectric material 202 may be inter alia, poly vinylidene fluoride (PVDF) film and/or Tri Glycerin Sulphate (TGS). Examples of opaque pyroelectric material may be, inter alia PZT (Lead Zirconate Titanate), PST (Lead Stannic Titanate) and LiTaO3 (Lithium Tantalate).

In one embodiment, the pyroelectric material 202 may also have characteristics of piezoelectric material. In an example embodiment, the pyroelectric-piezoelectric material may be chosen from inter alia aluminium nitride, PST (Lead Scandium Tantalate), PZT (Lead Zirconium Titanate), Lithium Niobate, Lithium Tantalate, etc.

In one embodiment, an arrangement to draw electrical leads 208 through which an electric energy may be withdrawn may be coupled to either both the first layer of the first material 204 and pyroelectric material 202 and/or the second layer of the second material 206 and the pyroelectric material 202. In one embodiment, in an arrangement where the first layer of the first material 204 and/or the second layer of the second material 206 are metal then the first layer of first material and/or the second layer of second material may act as electrodes. In one embodiment, the arrangement of the pyroelectric material 202 coupled between the first layer of the first material 204 and second layer of second material may be used to generate a substantially continuous electric power from the pyroelectric material 202.

In one embodiment, more than one pyroelectric material may be coupled between the first layer of first material 204 and the second layer of the second material 206. In one embodiment, the more than one pyroelectric material may be a number of layers of different pyroelectric materials coupled between the first layer of first material 204 and the second layer of the second material 206 based on a desired electric power and an application.

Now refer back to FIG. 1. In one embodiment, the pyroelectric material coupled between a first layer of a first material and a second layer of a second material 102 may be heated based on the heat energy (e.g., sun's rays) and/or may be subjected to an electric field energy 104. In one embodiment, the first layer of the first material 204 and the second layer of the second material 206 may harness the heat energy and/or the electric field energy to generate a temporal change in temperature and/or a varying electric field 106. In one embodiment, the pyroelectric material coupled between a first layer of a first material and a second layer of a second material 102 may generate a substantially continuous electric energy (electric power) when subjected to the temporal change in temperature and/or a varying electric field 106 as illustrated in FIG. 3 to FIG. 5D.

In one embodiment, substantially continuous electric power 108 may be a non-decaying electrical power. In one embodiment, the substantially continuous electric power 108 may be a usable power. In an example embodiment, the substantially continuous electric power 108 may be used to supplement the electric current from a solar cell and/or a solar panel. In another example embodiment, the substantially continuous electric power 108 may be used directly for other suitable purposes without being applied to a solar cell and/or solar panel.

Figure 3:
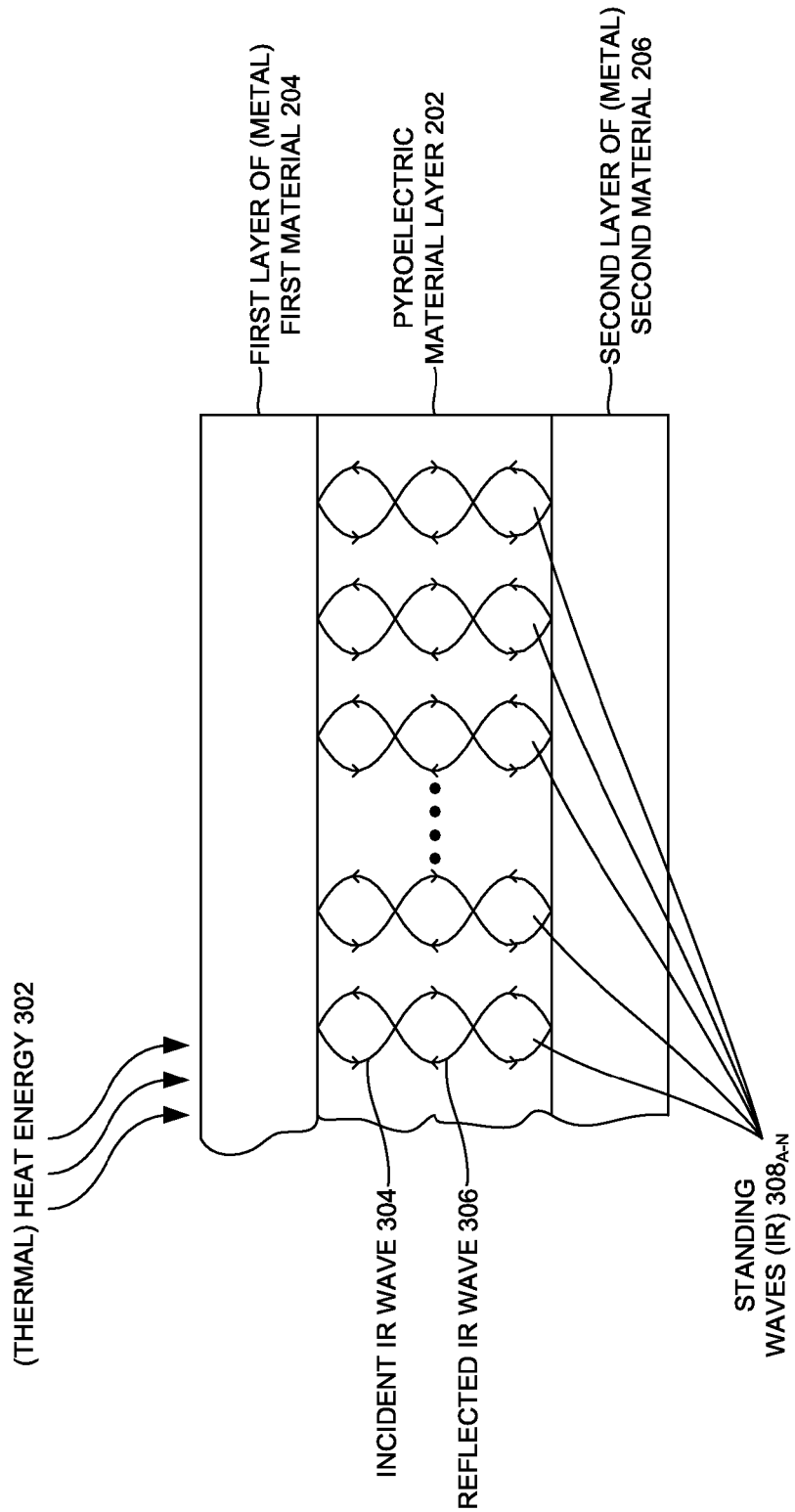
FIG. 3 illustrates generation of substantially continuous electric power from a pyroelectric material when the pyroelectric material is coupled between two metal layers, according to one or more embodiments.

Now refer to FIG. 3. FIG. 3 illustrates generation of substantially continuous electric power from a pyroelectric material when the pyroelectric material is coupled between two metal layers, according to one or more embodiments. In particular FIG. 3 illustrates a first layer of a first material 204, second layer of a second material 206, a pyroelectric material 202, heat energy 302, incident wave 304, reflected wave 306 and/or standing waves $308_{a-n}$.

In one embodiment, the first layer of the first material 204 and/or the second layer of the second material 206 may be a metal. In an example embodiment, the metal may be titanium. In one embodiment, the first layer of the first material 204 and/or the second layer of the second material 206 may be coupled to the pyroelectric material 202 through coating opposite surfaces of the pyroelectric material 202 with the first layer of the first material 204 and/or the second layer of the second material 206 respectively. In an example embodiment, the pyroelectric material 202 may be coated on opposite surfaces with titanium to form an electrode.

In one embodiment, on exposing the pyroelectric material coupled between the first layer of the metal 204 and/or the second layer of the metal 206 to heat energy 302, the metal on the surface of pyroelectric material 202 that is exposed to the heat energy 302 absorbs the radiation and heat. In one embodiment, the metal coated on the pyroelectric material 202 that absorbed the radiation and heat may emit a black body radiation. In one embodiment, the black body radiation may be an infrared radiation. In one embodiment, the infrared radiation that is radiated may be incident infrared wave 304. In one embodiment, the incident infrared wave 304 may be reflected by the metal coated on the opposite side of the pyroelectric material between which the pyroelectric material is coupled. In one embodiment, the incident infrared wave 304 and the reflected infrared wave 306 may form a number of infrared standing waves $308_{a-n}$ in the pyroelectric material 202. In one embodiment, the infrared standing waves $308_{a-n}$ may create oscillating temperature (temporal gradient of temperature) spots in the pyroelectric material 202 that is coupled between the first layer of the first material 204 and/or the second layer of the second material 206 where the first material and the second material is a metal. In one embodiment, the temporal temperature gradient may create a stable voltage and current (e.g., substantially continuous electric power 108).

In one embodiment, the heat energy 302 may be collected at the metal layer and dissipated as black body radiation when the first later of the first material and/or the second layer of the second material is metal. In one embodiment, the infrared radiation of the black body radiation may travel through the pyroelectric material 202 towards the second layer of the second material 206 (when the incident infrared wave 304 originates from the first layer of the first material 204). In one embodiment, the layer opposite to the layer that radiates the infrared radiation (second layer of the second material 206) may reflect the infrared radiation radiated by the first layer of the first material 204. In one embodiment, the incident infrared wave and the reflected infrared wave may interfere and combine to form an infrared standing wave. In one embodiment, standing wave may be a stationary wave that stands at a constant position as illustrated in FIG. 3.

In one embodiment, the first material and/or the second material may be a metal and/or a thermally conductive material. In one embodiment, the thermally conductive element 204 and/or 206 may be coupled to the pyroelectric material 202. In an example embodiment, the thermally conductive element 204 and/or 206 may desirably be a metal with a low specific heat value, such as copper, tungsten and the like. In one embodiment, the thermally conductive element may be configured to be in contact with a surface of the pyroelectric material 202. In one embodiment, since the thermally conductive material may have a low specific heat value, the first layer of the first material 204 and/or the second layer of the second material 206 may require relatively less externally applied heat to cause it to heat up to a desired temperature. In other words, the first layer of the first material 204 and/or the second layer of the second material 206 may increase in temperature at a rapid pace when relatively little heat is applied. This enhances the thermal gradient over a short amount of time, and the increased temperature of the thermal element 204/206 may conduct to the pyroelectric material 202, thereby passing to pyroelectric material 202 and increasing the temporal temperature gradient dT/dt in the pyroelectric material 202.

In one embodiment, when the first material (e.g., first layer of the first material 204) and the second material (e.g., second layer of the second material 206) are a metal coating that radiates black body radiation, the first layer of the first material 204 and the second layer of the second material 206 may generate the temporal temperature gradient in the at least one layer of pyroelectric material 202 through creation of an infrared standing wave when the first layer of the first material 204 absorbs the heat energy 302 and radiates an infrared wave to the second layer of second material 206 through the at least one layer of pyroelectric material 202 and the second layer of the second material 206 reflects the infrared wave to interfere with the incident infrared wave to form the IR standing wave 308.

Now refer to FIG. 4. FIG. 4 illustrates generation of substantially continuous electric power from a pyroelectric-piezoelectric material when a pyroelectric-piezoelectric material is coupled between two metal layers, according to one or more embodiments. In particular FIG. 4 illustrates a first layer of a first material 204, second layer of a second material 206, a pyroelectric-piezoelectric material 402, heat energy 302, incident photon 404, reflected phonons 406.

In one embodiment, the pyroelectric material may also be a piezoelectric. In one embodiment, when the pyroelectric material may also have characteristics of piezoelectric material, the electric field energy created due to the pyroelectric characteristics of the pyroelectric-piezoelectric material may cause a mechanical vibration in the pyroelectric-piezoelectric material. In one embodiment, the mechanical vibration may cause a temperature oscillation inside the pyroelectric-piezoelectric material. In one embodiment, the temperature oscillation may result in an electric field. In one embodiment, the electric field may cause the pyroelectric-piezoelectric material to vibrate resulting in a resonance effect. In one embodiment, the resonance effect may result in generating a non-decaying electric power from the pyroelectric-piezoelectric material. In one embodiment, the electric field which may cause piezoelectric characteristics of the pyroelectric-piezoelectric material to create a mechanical pressure (vibration) which in turn may give rise to an electric field may be generated through the charge created on the pyroelectric-piezoelectric material on subjecting the pyroelectric-piezoelectric material to heat energy. The pyroelectric characteristics of the pyroelectric-piezoelectric material may create the charge on being subjected to heat energy.

In one embodiment, a phonon may be a collective excitation of an arrangement of atoms in a condensed matter. However, in the example embodiment of FIG. 4, a phonon may be represented as a particle for merely purposes of ease of illustration.

In one embodiment, heat energy 302 may get absorbed by the top electrode (first layer of first material 204 and/or second layer of second material 206) and may emit black body radiation to the pyroelectric-piezoelectric material 402. The pyroelectric-piezoelectric material 402 may get charged and cause a mechanical oscillations in the pyroelectric-piezoelectric material 402. These oscillations may generate phonons. The phonons may get reflected by the bottom electrode 206. The incident phonons 404 and reflected phonons 406 may interfere to create standing waves 408. These standing waves 408 may create local thermal oscillations inside the pyroelectric-piezoelectric material 402 giving rise to a substantially continuous electric power 108.

Figure 5A:
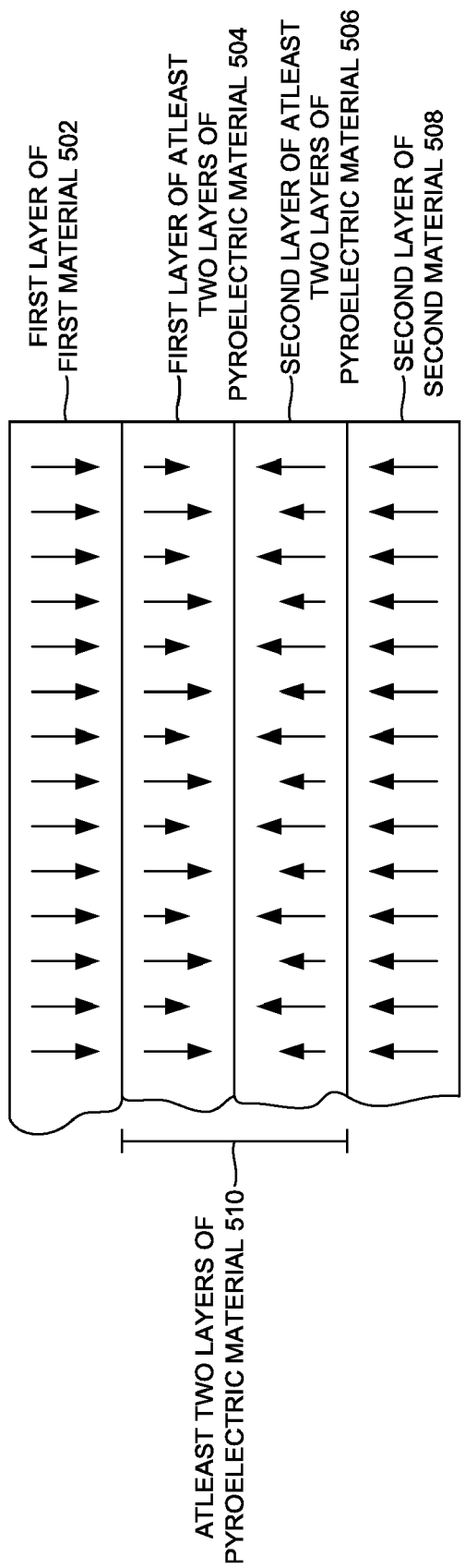
FIG. 5A illustrates layers of pyroelectric material coupled between a first layer of a first material and a second layer of a second material when at least one of the first and the second material is a strongly polarized pyroelectric material to generate a substantially continuous electric power, according to one or more embodiments.

Now refer to FIGS. 5A-5D. FIG. 5A illustrates layers of pyroelectric material coupled between a first layer of a first material and a second layer of a second material when at least one of the first and the second material is a strongly polarized pyroelectric material to generate a substantially continuous electric power, according to one or more embodiments. In particular FIG. 5A illustrates a first layer of a first material 502, a first layer of at least two layers of pyroelectric material 504, a second layer of at least two layers of pyroelectric material 506, a second layer of a second material and/or at least two layers of pyroelectric material 510.

In one embodiment, the first layer of the first material 502 and/or the second layer of the second material 508 may be a strongly polarized pyroelectric material. In one embodiment, the polarization of the first layer of the first material 502 and/or the second layer of the second material 508 may be a permanent remnant polarization. In one embodiment, the first layer of the first material 502 and/or the second layer of the second material 508 having permanent remnant polarization may possess characteristics of a permanent magnet. In one embodiment, the dipoles associated with the first layer of the first material 502 may be polarized to align in a direction that is opposite to the direction in which the dipoles associated with the second layer of the second material 508 may be aligned as illustrated in FIG. 5A.

In one embodiment, an at least two layers of pyroelectric material 510 may be coupled between the first layer of the first material 502 and/or the second layer of the second material 508 where the first layer of the first material 502 and/or the second layer of the second material 508 may be a strongly polarized pyroelectric material. In one embodiment, a first layer of the at least two layers of pyroelectric material 504 coupled between the first layer of the first material 502 and/or the second layer of the second material 508 may be a weakly polarized pyroelectric material as compared to the strongly polarized pyroelectric material that forms the first layer of the first material 502 and/or the second layer of the second material 508. In one embodiment, the alignment of the dipoles associated with the first layer of at least two layers of pyroelectric material 504 that are weakly polarized may be in the direction of the alignment of the dipoles associated with the first layer of the first material 502. In one embodiment, a second layer of the at least two layers of pyroelectric material 506 coupled between the first layer of the first material 502 and/or the second layer of the second material 508 may be a weakly polarized pyroelectric material as compared to the strongly polarized pyroelectric material that forms the first layer of the first material 502 and/or the second layer of the second material 508. In one embodiment, the alignment of the dipoles associated with the second layer of at least two layers of pyroelectric material 504 that are weakly polarized may be in the direction of the alignment of the dipoles associated with the second layer of the second material 502 which is opposite to the direction of alignment of the dipoles in the first layer of the first material 502 and/or the first layer of at least two layers of pyroelectric material 504.

In one embodiment, the first layer of the first material 502 and/or the second layer of the second material 508 may be formed from the same pyroelectric material or different pyroelectric materials. In one embodiment, the first layer of the at least two layers of pyroelectric material and the second layer of the at least two layers of pyroelectric materials may be formed from the same pyroelectric material or different pyroelectric materials.

In one embodiment, a substantially continuous electric power (substantially continuous electric energy) may be generated from the at least two layers of pyroelectric material 510 through a process of electrostatic induction. In one embodiment, the generation of the substantially continuous electric power (substantially continuous electric energy) may be generated from the at least two layers of pyroelectric material 510 through the process of electrostatic induction may be illustrated in FIGS. 5B-FIG. 5D.

Figure 5B:
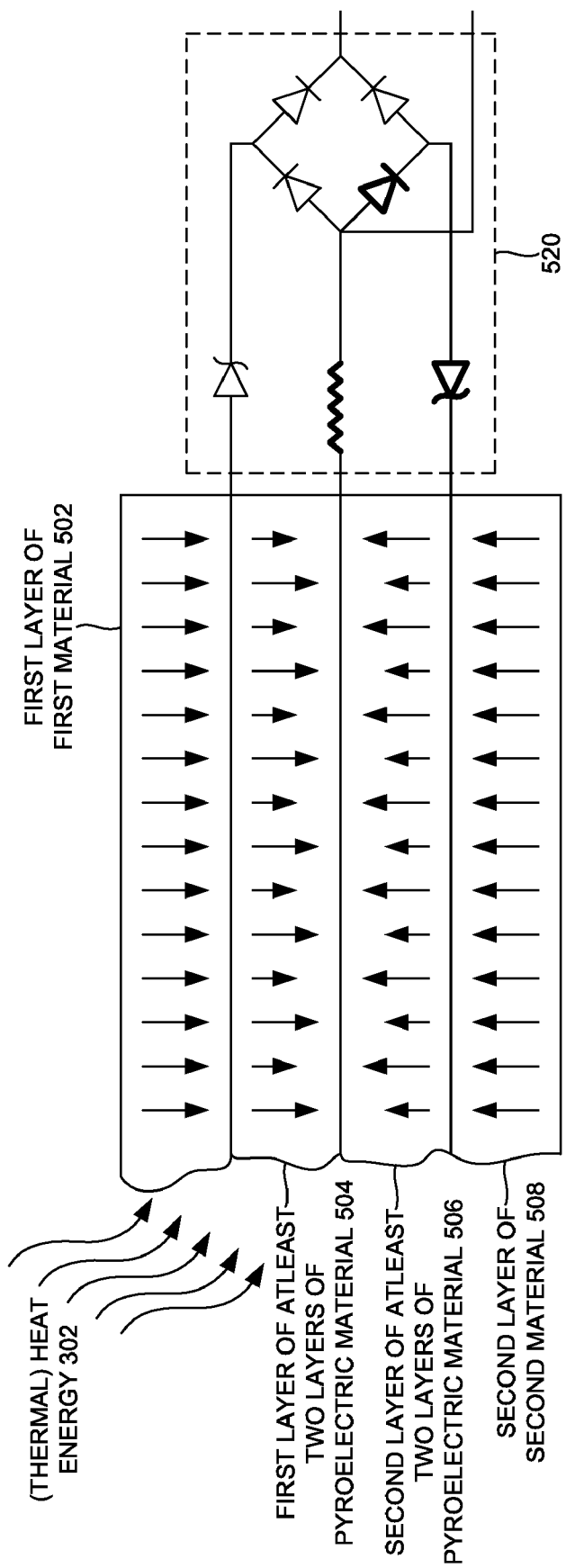
FIG. 5B illustrates a circuit arrangement for the generation of a substantially continuous electric energy from an at least two layers of pyroelectric material coupled between layers of strongly polarized materials, according to one or more embodiments.
Figure 5C:
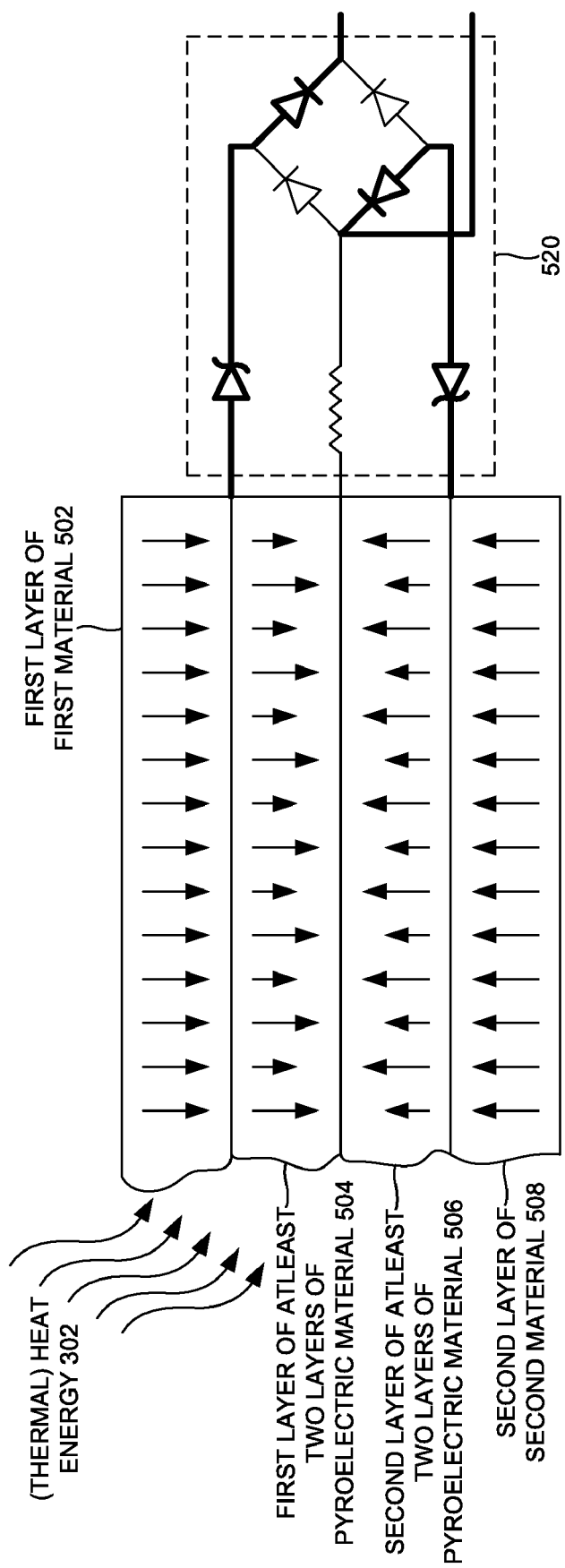
FIG. 5C is a process flow diagram illustrating storing a data block associated with a data stream in a bidirectional cache memory of the redundancy removal engine of FIG. 3, according to one or more embodiments.
Figure 5D:
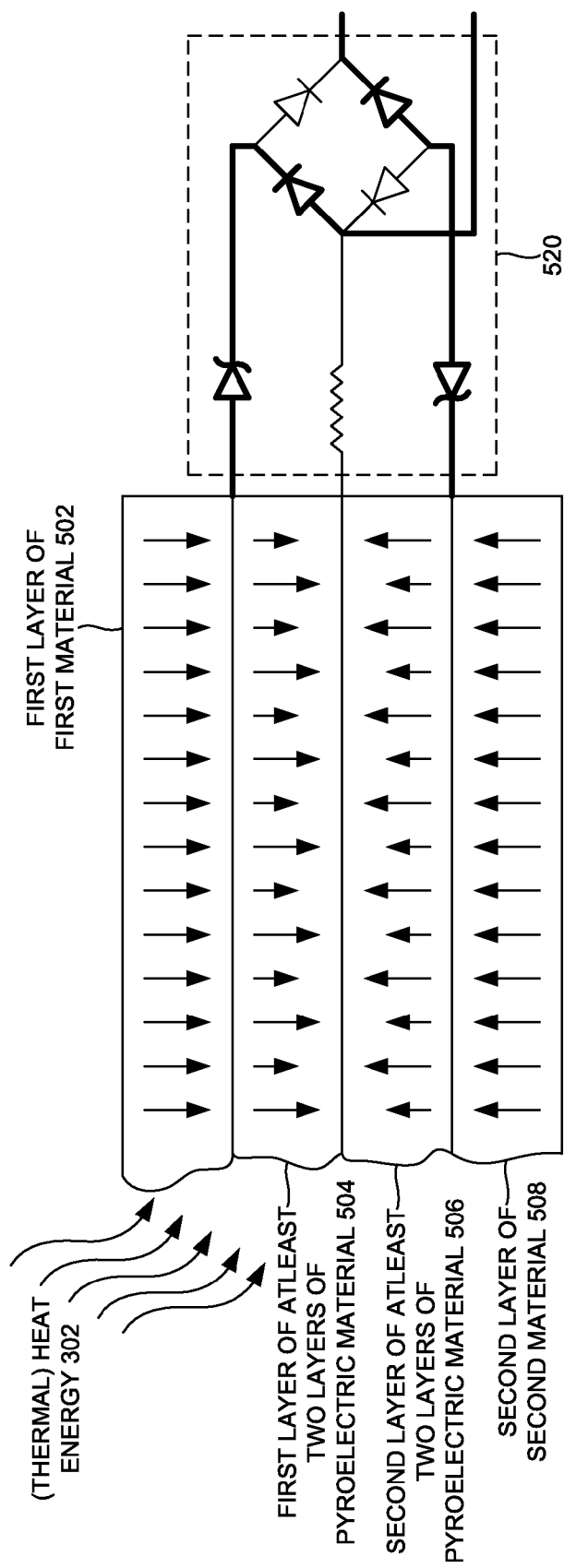

Now refer to FIG. 5B-FIG. 5D. FIG. 5B illustrates a circuit arrangement for the generation of a substantially continuous electric energy from an at least two layers of pyroelectric material coupled between layers of strongly polarized materials, according to one or more embodiments. In one embodiment, the at least two layers of pyroelectric material 510 may be coupled further to a discharge circuit 520. In one embodiment, the discharge circuit may process the output electric power from the at least two layers of pyroelectric material to transform the electric power from the at least two layers of pyroelectric material to a usable form. In one embodiment, the discharge circuit 520 may be a RC circuit. In another embodiment, the conditioning module 520 may be a full wave rectifier circuit coupled to the at least two layers of pyroelectric material 510 through a resistor and a pair of Shottky diodes. In one embodiment, the discharge circuit 520 may process the signal from the at least two layers of pyroelectric material to generate a ripple less constant electric power.

Now refer to FIG. 5C and FIG. 5D. FIG. 5C and FIG. 5D illustrates generation of a substantially continuous electric energy from the at least two layers of pyroelectric material coupled between strongly polarized pyroelectric materials, according to one or more embodiments. In one embodiment, the first layer of the at least two layers of pyroelectric material 504 may be polarized when subjected to heat energy 302. In one embodiment, the polarization of the first layer of the at least two layers of pyroelectric material 504 may result in forming an electric field. In one embodiment, the electric field produced due to polarization of the first layer of the at least two layers of pyroelectric material 504 may be used to reduce the electric field associated with the second layer of the at least two layers of pyroelectric material 506. In one embodiment, the electric energy associated with the first layer of the at least two layers of pyroelectric material 504 may then be extracted from the first layer of the at least two layers of pyroelectric material 504 through a processing circuit 520.

In one embodiment, when the electric energy from the first layer of the at least two layers of pyroelectric material 504 is discharged, the electric field associated with the first layer of the at least two layers of pyroelectric material 504 may become low and the polarization may be unsaturated. In one embodiment, the electric field associated with the first layer of the at least two layers of pyroelectric material 504 may be polarized again through an electrostatic induction from the second layer of the second material 508 and/or the first layer of the at least two layers of the pyroelectric material 504 and/or the heat energy 302. In one embodiment, the second layer of the at least two layers of pyroelectric material 506 may be discharged when the first layer of the at least two layers of pyroelectric material 504 gets charged and/or polarized. In one embodiment, the first layer of the at least two layers of pyroelectric material 504 and/or the second layer of the at least two layers of pyroelectric material 506 may be discharged through a RC discharge process via the discharge circuit 520. In one embodiment, the continuous charging and discharging of the first layer of the at least two layers of pyroelectric material 504 and/or the second layer of the at least two layers of pyroelectric material 506 may be repeated through electrostatic induction to generate a substantially continuous electric energy 108.

In one embodiment, the second layer of the at least two layers of pyroelectric material 506 may be manually discharged. In one embodiment, when the second layer of the at least two layers of pyroelectric material 506 is discharged, the first layer of the at least two layers of pyroelectric material 504 may be charged based on electrostatic induction from a first layer of first material 502. In one embodiment, when the first layer of the at least two layers of pyroelectric material 504 may result in generation of an electric energy. In one embodiment, when the electric energy associated with the first layer of the at least two layers of pyroelectric material 506 is discharged the second layer of the at least two layers of pyroelectric material 506 may get charged through electrostatic induction based on the second layer of the second material 508. In one embodiment, the electric energy associated with the second layer of the at least two layers of pyroelectric material 506 may be discharged. In one embodiment, the continuous charging and discharging of the second layer of the at least two layers of pyroelectric material 506 and/or the first layer of the at least two layers of pyroelectric material 504 may result in generation of a substantially continuous electric energy 108 which may be processed through the discharge circuit 520.

Figure 6:
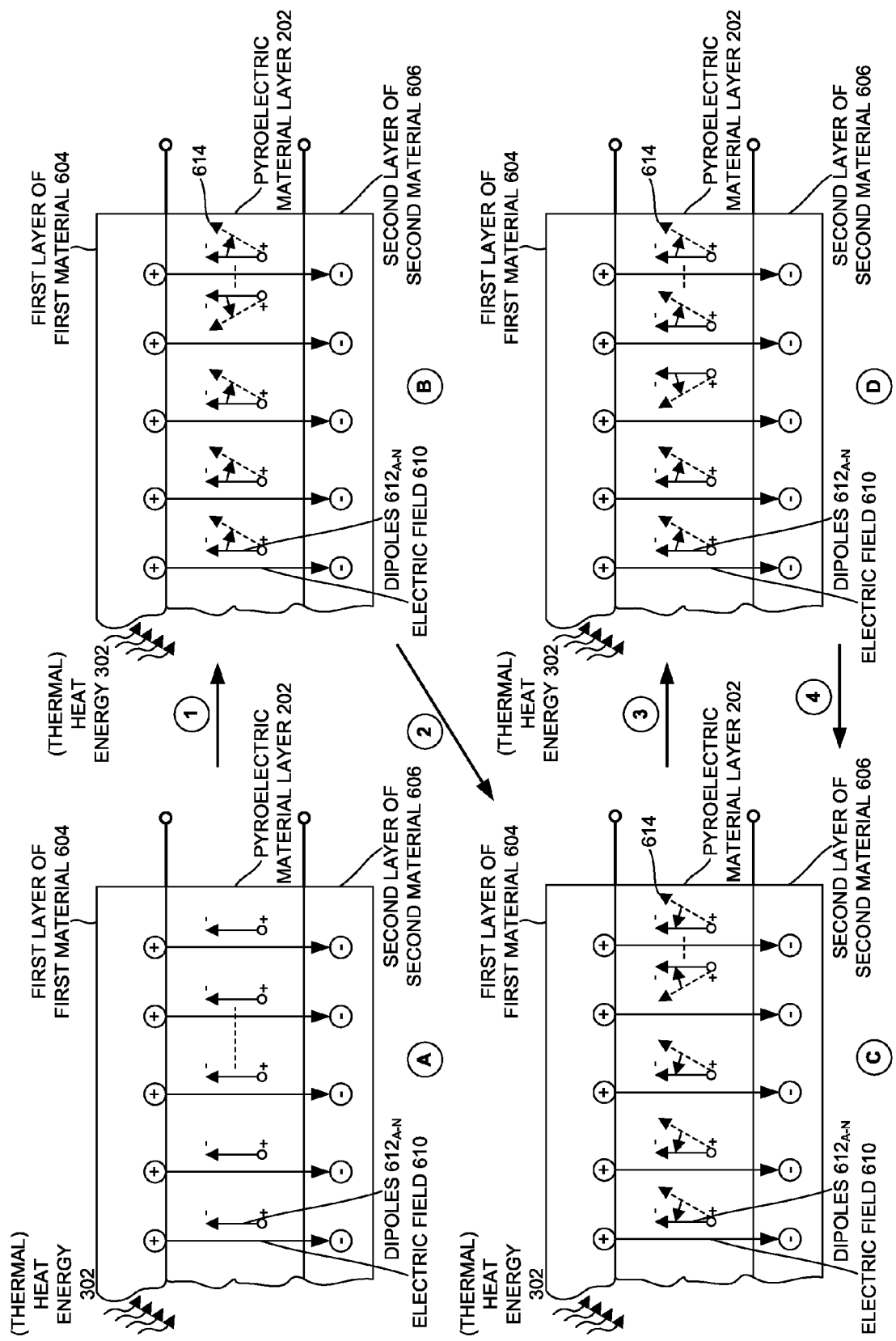
FIG. 6 illustrates generation of substantially continuous electric power from a pyroelectric material when a pyroelectric material is coupled between a first layer of a first material and a second layer of a second material when at least one of the first and the second material is a thermally ionizable material, according to one or more embodiments.

Now refer to FIG. 6. FIG. 6 illustrates generation of substantially continuous electric power from a pyroelectric material when a pyroelectric material is coupled between a first layer of a first material and a second layer of a second material when at least one of the first and the second material is a thermally ionizable material, according to one or more embodiments. In particular, FIG. 6 illustrates a pyroelectric material 202, a first layer of first material 604, a second layer of a second material 606, a heat energy 302, a number of dipoles 612$_{a-1}$, an electric field 610 and/or a rotated dipole in new position 614.

In one embodiment, a dipole associated with the pyroelectric material may be rotated when a heat energy is applied to the pyroelectric material. In one embodiment, the extent of rotation of the dipole associated with the pyroelectric material may be determined by the strength of the heat energy applied to the pyroelectric material. In one embodiment, the dipole may rotate at an angle. In one embodiment, when the pyroelectric material is further subjected to an electric field as well, the dipole may rotate back to its original position based on the electric field that's the pyroelectric material is subjected to in addition to the heat energy. In one embodiment, the dipole associated with the pyroelectric material may keep rotating back and forth to the original position when subjected to both the electric field energy and the heat energy as illustrated in process A-D of FIG. 6. In one embodiment, the continuous back and forth rotation of the dipole may generate substantially continuous electric power.

In an embodiment of FIG. 6, the pyroelectric material 202 may be coupled between a first layer of a thermally ionizable material 604 and a second layer of a thermally ionizable material 606. In one embodiment, the ions from the thermally ionizable material may generate a substantially continuous electric field 610 when subjected to heat energy 302 (thermal). In an example embodiment, the thermally ionizable material may be chosen from inter alia a material doped with metal ions such as Magnesium, nonmetals such as carbon and coating of various ionic solids and liquids. In one embodiment, the first layer of a thermally ionizable material 604 and a second layer of a thermally ionizable material 606 may be a thin layer. In one embodiment, the first layer of a thermally ionizable material 604 and a second layer of a thermally ionizable material 606 may be a thick layer. In one embodiment, the first layer of a thermally ionizable material 604 and a second layer of a thermally ionizable material 606 may a coating applied on the pyroelectric material 202. In one embodiment, the first layer of the first material 604 may be a thermally ionizable material and the second layer of the second material 606 may be a conductive layer.

In process A, the pyroelectric material 202 coupled in between the first layer of a thermally ionizable material 604 and a second layer of a conductive material 606 may be subjected to a heat energy (thermal) 302. In one embodiment, when the pyroelectric material 202 coupled in between the first layer of a thermally ionizable material 604 and a second layer of a conductive material 606 is subjected to the heat energy (thermal) 302, the ions represented by the +ve charge 620 create a electric field 610 between the first layer 604 and second layer 606 across the pyroelectric material 202. In one embodiment, the ions may be −ve ions and the electric field 610 may be in an opposite directions of the electric field 610 shown in FIG. 6. In one embodiment, when the pyroelectric material 202 may be subjected to heat energy 302 the dipole 612 associated with the pyroelectric material 202 may rotate by a certain angle to a position 614 in process B. In one embodiment, this rotation of the dipole 612 from its original position to position 614 may result in generation of electric energy. In one embodiment, the rotation may stop when the dipole reaches position 614 and the produced electric energy may be lost through neutralization with external charges.

In one embodiment, in process C, when the dipole 612 reaches position 614 the dipole maybe rotated back to its original position based on the electric field 610 to which the pyroelectric material 202 is subjected. In one embodiment the original position may be represented as the solid line and the new position may be represented as the dotted line. In one embodiment, the rotation of the dipole from position 614 to the original position may result in generation of an electric energy. In one embodiment, in process D once the dipole reaches the original position it may rotate back to position 614 or rotate to another new position at an angle form the original position. In one embodiment, the continuous back and forth rotation of the dipole 612 associated with the pyroelectric material 202 in the presence of the electric field 610 energy and/or the heat energy 302 may result in the generation of a substantially continuous electric power.

In one embodiment, when the first layer of the first material 204 is a thermally ionizable material and the second layer of the second material 206 is a conducting material, the first layer of the first material 204 and the second layer of the second material 206 to create an ionic charge based electric field which when the at least one layer of pyroelectric material 202 coupled in between the first layer of the first material 204 and the second layer of the second material 206 is subjected to in the presence of a heat energy 302 generates substantially continuous electric energy 108 through exploiting a change in an orientation of an electric dipole associated with the at least one layer of pyroelectric material 202 based on at least one of the ionic charge based electric field 610 and the heat energy 302.

Figure 7:
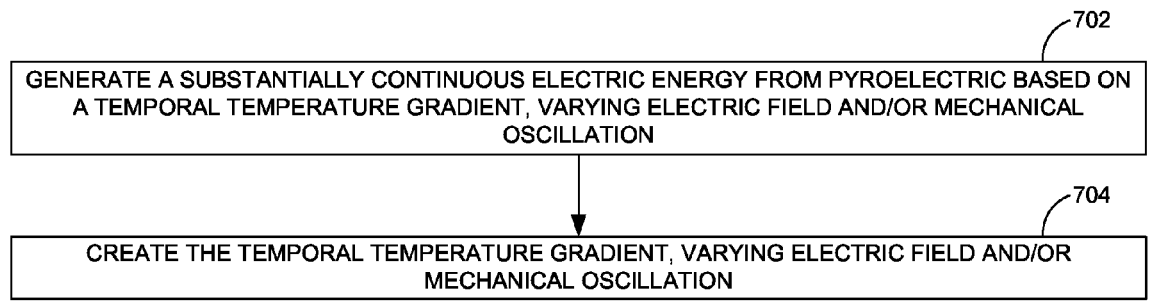
FIG. 7 is a process flow diagram that illustrates generation of substantially continuous electric power from a pyroelectric material, according to one or more embodiments.

Now refer to FIG. 7. FIG. 7 is a process flow diagram that illustrates generation of substantially continuous electric power from a pyroelectric material, according to one or more embodiments. In one embodiment, in operation 702, a substantially continuous electric energy 108 may be generated from an at least one layer of pyroelectric material 202 when the at least one layer of pyroelectric material is subjected to a temporal temperature gradient, a varying electric field and/or a mechanical oscillation 106. In one embodiment, in operation 704 the at least one of the temporal temperature gradient, the varying electric field and the mechanical oscillation 106 may be created through coupling the at least one layer of pyroelectric material 202 in between a first layer of a first material 204 and a second layer of a second material 206 that harnesses a heat energy and/or an electric field energy 104 to produce the temporal temperature gradient and/or the mechanical oscillation 106 to which the at least one layer of pyroelectric material is subjected.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware, firmware and software (e.g., embodied in a machine readable medium). For example, the various electrical structure and methods may be embodied using transistors, logic gates, and electrical circuits (e.g., application specific integrated (ASIC) circuitry and/or in digital signal processor (DSP) circuitry).

In addition, it will be appreciated that the various operations, processes, and methods disclosed herein may be embodied in a machine-readable medium and/or a machine accessible medium compatible with a data processing system (e.g., a computer devices), may be performed in any order (e.g., including using means for achieving the various operations). Accordingly, the specification and drawings are to be regarded in an illustrative rather than a restrictive sense.

What is claimed is:

1. A method comprising:
generating a substantially continuous electric energy from an at least one layer of pyroelectric material when the at least one layer of pyroelectric material is subjected to at least one of a temporal temperature gradient, a varying electric field and a mechanical oscillation; and
creating the at least one of the temporal temperature gradient, the varying electric field and the mechanical oscillation through coupling the at least one layer of pyroelectric material in between a first layer of a first material and a second layer of a second material that harnesses at least one of a heat energy and an electric field energy to produce at least one of the temporal temperature gradient and the mechanical oscillation to which the at least one layer of pyroelectric material is subjected,
wherein when the first layer of the first material and the second layer of the second material are a metal coating that radiates black body radiation, the first layer of the first material and the second layer of the second material generate the temporal temperature gradient in the at least one layer of pyroelectric material through creation of an infrared standing wave when the first layer of the first material absorbs the heat energy and radiates an infrared wave to the second layer of second material through the at least one layer of pyroelectric material and the second layer of the second material reflects the infrared wave to interfere with the incident infrared wave to form the infrared standing wave, and
wherein the temporal temperature gradient is a change in temperature with respect to time.

2. The method of claim 1, wherein when the first material is a pyroelectric material that is highly polarized and the second material is another pyroelectric material that is strongly polarized with an orientation of polarity different from the polarity of the first material and at least two layers of pyroelectric material that is coupled in between the first layer of first material and the second layer of second material is a pyroelectric material that is of weaker polarization than the pyroelectric material of the first layer of the first material and the pyroelectric material of the second layer of the second material and each of the at least two layers of pyroelectric material is of a different orientation of polarity from each other, the at least two layers of pyroelectric material generate a substantially continuous electric energy via the first layer of the first material and the second layer of the second material through creating varying electric field strengths between the each layer of the at least two layers of pyroelectric materials via an electrostatic induction effect.

3. The method of claim 1, wherein when the first material is a thermally ionizable material and the second material is a conducting material, the first layer of the first material and the second layer of the second material create an ionic charge based electric field which when the at least one layer of pyroelectric material coupled in between the first layer of the first material and the second layer of the second material is subjected to in the presence of a heat energy generates substantially continuous electric energy through exploiting a change in an orientation of an electric dipole associated with the at least one layer of pyroelectric material based on at least one of the ionic charge based electric field and the heat energy.

4. The method of claim 1, wherein when the first material and the second material are a metal coating that radiates black body radiation and when the at least one layer of pyroelectric material comprises a piezoelectric characteristic along with the pyroelectric characteristic, the at least one layer of pyroelectric material comprising the piezoelectric characteristic along with the pyroelectric characteristic generates substantially continuous electric energy through a resonance effect created when the at least one layer of pyroelectric material comprising the piezoelectric characteristic along with the pyroelectric characteristic is subjected to at least one of the heat energy and the electric field energy.

5. The method of claim 2, wherein the first layer of the first material and the second layer of the second material generate the substantially continuous electric energy from the at least two layers of pyroelectric material through creating the varying electric field strengths between the each layer of the at least two layers of pyroelectric materials via electrostatic induction, the creation of the varying electric field strengths further comprising:
polarizing a first layer of the at least two layers of pyroelectric material when the first layer of the at least two layers of pyroelectric material is subjected to at least one of the heat energy and an electromagnetic induction from the first layer of first material that is strongly polarized, the first layer of first material being adjacent to the first layer of the at least two layers of pyroelectric material; and
changing an electric field strength associated with a second layer of the at least two layers of pyroelectric material through the electric field associated with the first layer of the at least two layers of pyroelectric material that is generated through polarizing the first layer of the at least two layers of pyroelectric material.

6. The method of claim 3, further comprising:
creating the ionic charge based electric field between the ionic layer and the conduction layer between which the at least one layer of pyroelectric material is coupled when the ionic layer is subjected to the heat energy;
changing the orientation of the electric dipole associated with the at least one layer of pyroelectric material from an initial orientation to another orientation when the at least one layer of pyroelectric material is subjected to the heat energy;
rotating the electric dipole back to the initial orientation from the other orientation through the ionic charge based electric field energy associated with the electric field created between the ionic layer and the conduction layer between which the at least one layer of pyroelectric material is coupled when the electric dipole stops changing orientation thereof based on the heat energy and is currently at the other orientation; and generating an electric energy based on at least one of the change in the orientation of the electric dipole associated with the at least one layer of pyroelectric material from the initial orientation to the other orientation due to the heat energy and from the other orientation back to the initial orientation due to the ionic charge based electric field energy, the electric energy generated being proportional to the degree of change in orientation of the electric dipole associated with the at least one layer of pyroelectric material.

7. The method of claim 5, further comprising:

discharging the first layer of the at least two layers of pyroelectric material through a discharge circuit.

* * * * *